(12) United States Patent
Khaira et al.

(10) Patent No.: US 7,171,347 B2
(45) Date of Patent: Jan. 30, 2007

(54) LOGIC VERIFICATION IN LARGE SYSTEMS

(75) Inventors: Manpreet S. Khaira, Portland, OR (US); Steve W. Otto, Portland, OR (US); Honghua H. Yang, Portland, OR (US); Mandar S. Joshi, Aloha, OR (US); Jeremy S. Casas, Portland, OR (US); Erik M. Seligman, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 09/347,690

(22) Filed: Jul. 2, 1999

(65) Prior Publication Data

US 2003/0163297 A1  Aug. 28, 2003

(51) Int. Cl.
G06F 17/50 (2006.01)
G06F 9/455 (2006.01)
G06F 9/45 (2006.01)

(52) U.S. Cl. ............... 703/15; 703/14; 703/28; 716/1; 716/2; 716/7

(58) Field of Classification Search ............ 703/15, 703/14, 28; 716/18, 2, 1, 3, 4, 7, 8, 12, 16; 713/400; 710/104, 305; 709/250
See application file for complete search history.

(56) References Cited

U.S. PATENT DOCUMENTS 5,260,949 A * 11/1993 Hashizume et al. ........ 714/731
5,469,366 A    11/1995 Yang et al.
5,787,009 A *  7/1998 Pedersen ..................... 716/7
5,828,579 A * 10/1998 Beausang ..................... 716/2
5,903,466 A *  5/1999 Beausang et al. ............ 716/18
5,949,692 A *  9/1999 Beausang et al. ............ 716/18
5,956,256 A *  9/1999 Rezek et al. .................. 716/3

OTHER PUBLICATIONS

K. Hering, R. Haupt, Th. Villman, "Hierarchical Strategy of Model Partitioning for VLSI-Design Using an Improved Mixture of Experts Approach." Parallel and Distrubted Simulation, 1996. Pads 96. Proceedings. Tenth Workshop on, 1996 pp. 106-113.*

M. L. Bailey, J. V. Briner, Jr., R. D. Chamberlain, "Parallel Logic Simulation of VLSI Systems," ACM Computing Surveys, vol. 26, No. 3, Sep. 1994.*

(Continued)

Primary Examiner—Paul Rodriguez
Assistant Examiner—Dwin McTaggart Craig
(74) Attorney, Agent, or Firm—Schwegman, Lundberg, Woessner & Kluth, P.A.

(57) ABSTRACT

A method of preparing a circuit model for simulation comprises decomposing the circuit model having a number of latches into a plurality of extended latch boundary components and partitioning the plurality of extended latch boundary components. Decomposing and partitioning the circuit model may include decomposing hierarchical cells of the circuit model, and using a constructive bin-packing heuristic to partition the plurality of extended latch boundary components. The partitioned circuit model is compiled, and simulated on a uni-processor, a multi-processor, or a distributed processing computer system.

15 Claims, 4 Drawing Sheets

OTHER PUBLICATIONS

Thomas Hollstein, Jurgen Becker, Andreas Kirschbaum, Manfred Glesner, "HiPART: A New Hierarchical Semi-Interactive HW-/SW Partitioning Approach with Fast Debugging for Real-Time Embedded Systems", Proceedings, Mar. 1998, 5 pages.*

Naraig Manjikian, Wayne M. Loucks, "High Performance parallel logic simulations on a network of workstations", ISSN:0163-6103, ACM 1993, pp. 76-84.*

Bryant, R.E., et al., "COSMOS: A Compiled Simulator for MOS Circuits", *Proceedings of the 24th ACM/IEEE Design Automation Conference*, Miami Beach, FL, pp. 9-16, (1987).

Casas, J., et al., "Logic Verification of Very Large Circuits Using Shark", *Proceedings of the Twelfth International Conference on VLSI Design*, Goa, India, pp. 310-317, (Jan. 7-10, 1999).

Manjikian, N., et al., "High Performance Parallel Logic Simulation on a Network of Workstations", *Proceedings of the 7th Workshop on Parallel and Distributed Simulation(PADS)*, San Diego, CA, pp. 76-84 (May 16-19, 1993).

* cited by examiner

LOGIC VERIFICATION IN LARGE SYSTEMS

FIELD

This invention relates to logic verification in digital systems, and more particularly, it relates to logic verification in large and complex digital systems.

BACKGROUND

The process of designing a large and complex digital system includes reducing a system architecture to a high level behavioral system model and then translating the system model into an equivalent low level circuit model comprising logic devices and storage devices, such as gates and latches. The translation process may introduce errors into the circuit model, so another process known as logic verification is performed to identify errors introduced during the translation process. During the logic verification process, the functionality of the circuit model is compared to the functionality of the high level behavioral system model to ensure that the two models are functionally equivalent.

The logic verification process is implemented on systems characterized as primarily hardware based systems or on systems characterized as primarily software based systems. A hardware based system that performs logic verification of complex digital system models is known as a hardware emulator. A hardware emulator provides reasonable turn-around time for a small number of system designers and testers seeking to verify the performance of a digital system. Unfortunately, a hardware emulator has several disadvantages. First, being a custom solution tailored to the verification of a particular digital system design, a hardware emulator is a very expensive system to develop and replicate. Second, since a hardware emulator is expensive to replicate and since a single emulator can only support a small number of system designers and testers, it is difficult to reduce the design cycle time for a digital system without a large increase in capital expenditures.

Software based logic verification systems have been in use for many years. They are used extensively in the development of digital systems requiring only low or medium levels of circuit integration. Unfortunately, for complex digital systems, such as microprocessors, which are highly integrated devices, the development of traditional software based logic verification systems has not kept pace with the demands of verifying the performance of the large and complex digital systems.

For these and other reasons there is a need for the present invention.

SUMMARY

A method of preparing a circuit model for simulation comprises decomposing the circuit model having a number of latches into a plurality of extended latch boundary components and partitioning the plurality of extended latch boundary components.

DETAILED DESCRIPTION

Figure 1:
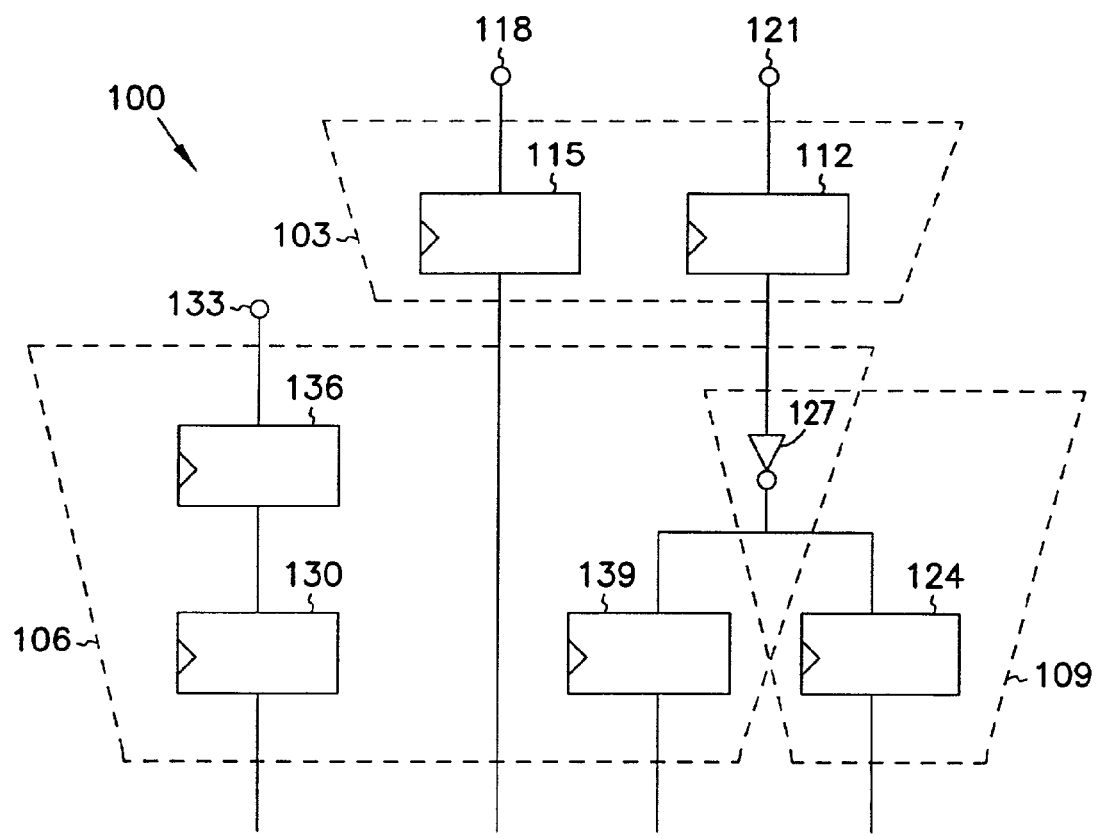
FIG. 1 is a circuit diagram decomposed into extended latch boundary components.

FIG. 1 shows circuit diagram 100 divided into extended latch boundary components 103, 106, and 109. A latch boundary component is a fanin cone that starts from latches or primary outputs and ends at latches or primary inputs. An elementary latch boundary component contains a single output and no internal latches. An extended latch boundary component, in one embodiment, is formed by clustering elementary latch boundary components, and in contrast with an elementary latch boundary component, an extended latch boundary component may contain an internal latch. In one embodiment, extended latch boundary component 103 includes latches 112 and 115 and primary inputs 118 and 121. Extended latch boundary component 109 includes latch 124 and inverter 127. In an alternate embodiment, an extended latch boundary component is formed by selecting a path having a first node that is either a latch or a primary output, a second node that is either a latch or a primary input, and a latch between the first node and the second node. Extended latch boundary component 106 includes two paths. The first path includes latch 130, primary input 133, and latch 136 located between latch 130 and primary input 133. The second path includes latch 139 and inverter 127.

Figure 2:
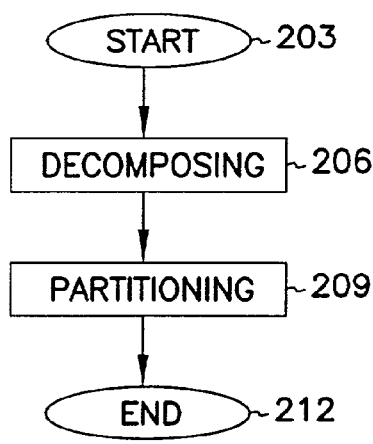
FIG. 2 is a flow diagram of some embodiments of a method of preparing a circuit model for simulation.

FIG. 2 is a flow diagram of some embodiments of a method 200 of preparing a circuit model for simulation. A circuit model, as described above, includes gates, latches, primary inputs, and primary outputs. Method 200 begins at start 203, and includes a decomposing 206 operation, a partitioning 209 operation, and terminates at end 212. In the decomposing 206 operation, the circuit model is decomposed into a plurality of extended latch boundary components. In the partitioning 209 operation, the plurality of extended latch boundary components identified in the decomposing operation 203 are partitioned.

A circuit model organized as a hierarchical arrangement of cells is decomposed into a plurality of extended latch boundary components. At the highest level of the hierarchy, cells having a size less than a particular value are identified and decomposed into a plurality of extended latch boundary components. At the second highest level of the hierarchy, cells of the circuit model having a size less than the given value and not decomposed at the highest level are identified and decomposed into a plurality of extended latch boundary components. This process is repeated on cells located at lower and lower levels of the hierarchy until the complete circuit model is decomposed into extended latch boundary components generated from the latches, primary outputs, and primary inputs in each cell.

Figure 3A:
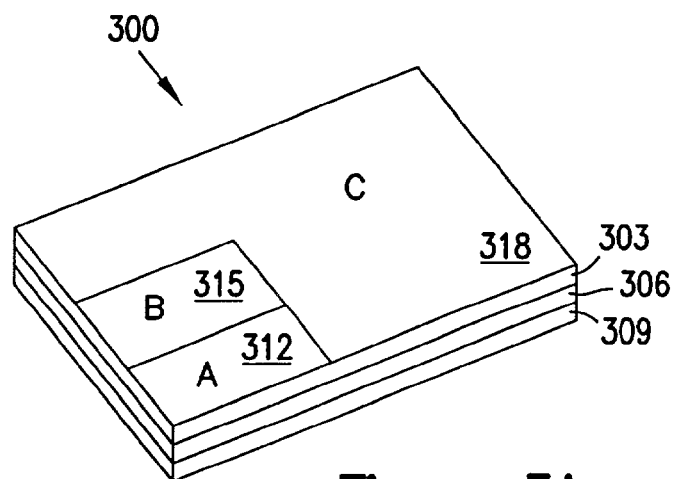
FIG. 3A is a perspective view of a three layer hierarchical arrangement of a plurality of cells in a circuit model.
Figure 3B:
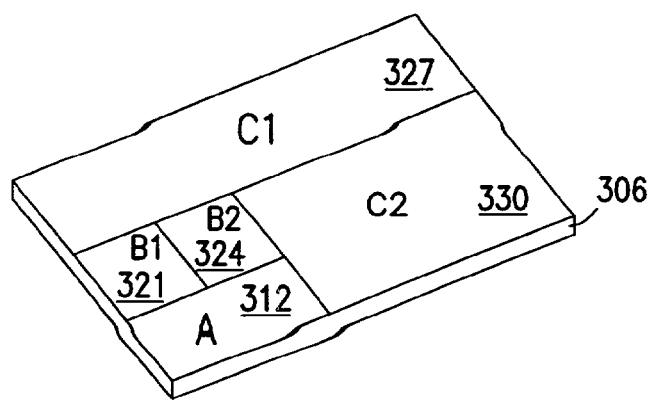
FIG. 3B is a perspective view of the second layer of FIG. 3A.
Figure 3C:
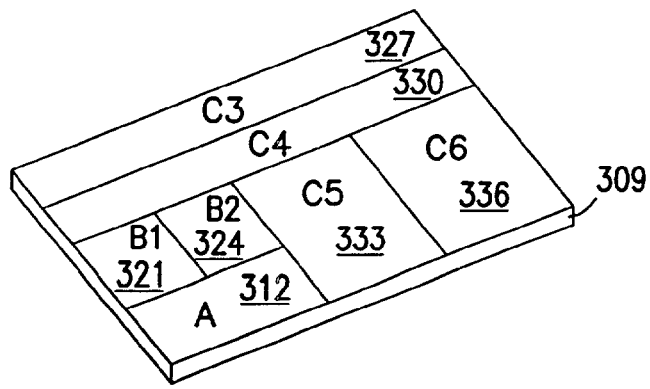
FIG. 3C is a perspective view of the third layer of FIG. 3A.

FIG. 3A is a perspective view of a three layer hierarchical arrangement of a plurality of cells in a circuit model. Hierarchical arrangement 300, in one embodiment, includes first level 303, second level 306, and third level 309. At first level 303, the circuit model is divided into cell A 312, cell B 315, and cell C 318. FIG. 3B is a perspective view of the second level of FIG. 3A. At second level 306, cell A 312 is unchanged, cell B 315 is divided into cell B1 321 and cell B2 324, and cell C is divided into cell C1 327 and cell C2 330. FIG. 3C is a perspective view of the third level of FIG. 3A. At third level 309, cell A 312, cell B1 321, and cell B2 324 are unchanged, and cell C1 is divided into cell C3 327 and cell C4 330, and cell C2 330 is divided into cell C5 333 and cell C6 336.

If cell A 312 contains two million transistors, and cell B 315 contains four million transistors, and cell C 318 contains six million transistors, and an extended latch boundary component is restricted in size to two million transistors, then the circuit model is divided into extended latch boundary components as follows. Cell A 312 contains only two million transistors at first level 303, so cell A 312 supports a single extended latch boundary component.

Cell B 315 contains four million transistors at first level 303, and does not meet the size constraint for an extended latch boundary component, so cell B 315 does not support a single latch boundary component. At second level 306 cell B 315 is divided into cell B1 321 and cell B2 324, and if the transistors of cell B 315 are evenly distributed across cell B1 321 and cell B2 324, then each cell contains two million transistors, and each cell supports a single extended latch boundary component.

Cell C 318 contains six million transistors at first level 303, and does not meet the size constraint for an extend latch boundary component, so cell C 318 cannot support a single latch boundary component. If the transistors are evenly divided between cell C1 327 and cell C2 330 at second level 306, then neither cell meets the size constraint of two million transistors per extended latch boundary component, so third level 309 must be examined. At third level 309 cell C 318 of first level 303 is divided into C3 327, C4 330, C5 333, and C6 336. Again, if the transistors are evenly divided among the four cells, then each cell contains one and one-half million transistors and each cell can support a single extended latch boundary component.

The process of hierarchical decomposition of a circuit model into extended latch boundary components described above is summarized as follows. First, select a size for an extended latch boundary component. Second, determine the size of each cell in the circuit model at the highest hierarchical level. Third, generate an extended latch boundary component for each cell in which the size of the cell is less than or equal to the selected size. Fourth, go down one hierarchical level and repeat the third step for the cells on that level that are not yet decomposed. Fifth, repeat the fourth step of the process until the complete circuit model is decomposed into extended latch boundary components.

Figure 4:
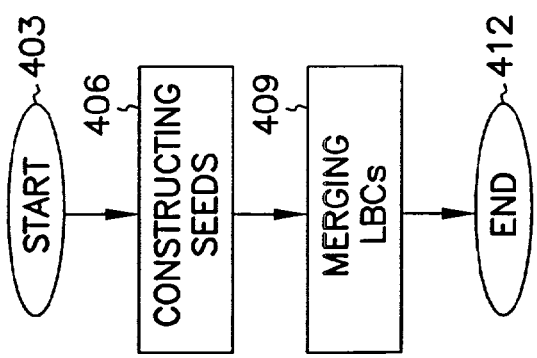
FIG. 4 is a flow diagram of some embodiments of a method of using a constructive bin-packing heuristic to partition the plurality of extended latch boundary components.

After a circuit model is decomposed into a plurality of extended latch boundary components, the partitioning 209 operation of FIG. 2 arranges the plurality of extended latch boundary components into groups. One goal of partitioning is to maintain load balance while minimizing circuit overlap in the partitions. In one embodiment, the partitioning 209 operation uses a constructive bin-packing heuristic to partition a plurality of extended latch boundary components. FIG. 4 is a flow diagram of some embodiments of a method 400 of using a constructive bin-packing heuristic to partition the plurality of extended latch boundary components. Method 400 begins at start 403, and includes a constructing seeds 406 operation, a merging extended latch boundary components (LBCs) 409 operation, and terminates at end 412. In the constructing seeds 406 operation, a plurality of extended latch boundary components are selected as seeds for partitions. In the merging extended LBCs 409 operation, each extended latch boundary component that is not a seed is grouped with one of the seeds constructed in the constructing seeds 406 operation.

In one embodiment, the number (P) of seeds or partitions is selected to equal the number of processors available to simulate the circuit model. In bin-packing, a plurality of seeds or partitions are constructed from the plurality of extended latch boundary components and assigned to bins. The extended latch boundary components are selected as seeds for the P partitions by assigning the P largest and well separated extended latch boundary components having the smallest overlap to the P bins as seeds. For the remaining extended latch boundary components, an unassigned latch boundary component that has the most overlap with the assigned extended latch boundary components is selected and merged with the bin that yields the best load balance and lowest circuit replication after the merge. In one embodiment, the best load balance is achieved by balancing a critical weight function of the number of latches, the activation of the latches during different clock phases, and the size of the extended latch boundary components. The process is repeated until all the latch boundary components are assigned to the bins.

In an alternate embodiment, the partitioning 209 operation of FIG. 2 uses a constructive bin-packing heuristic employing activity based load balancing as the weight factor during bin-packing. Activity based load balancing has not previously been recognized as a useful heuristic for partitioning extended latch boundary components. The weight factor is based on subcircuit activity data, and the weight factor is used during the bin-packing operation to select extended latch boundary components to merge with particular seeds. The subcircuit activity data is usually acquired during the development of the subsystems that make up the circuit model. The goal in selecting a particular extended latch boundary component for inclusion in a particular bin is to equalize the circuit activity during the simulation across all bins.

Figure 5:
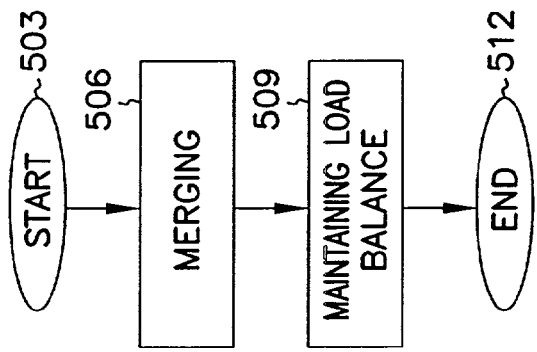
FIG. 5 is a flow diagram of some embodiments of a method of preparing a circuit model for simulation while load balancing.

FIG. 5 is a flow diagram of some embodiments of a method 500 of preparing a circuit model for simulation while load balancing. Method 500 begins at start 503, and includes a merging 506 operation, a maintaining load balance 509 operation, and terminates at end 512. In the merging 506 operation, a plurality of extend latch boundary components are merged into a plurality of partitions. In the maintaining load balance 509 operation, load balance is maintained among the plurality of partitions as extended latch boundary components are merged into the partitions. Load balancing, in one embodiment, is maintained by balancing the number of latches among the partitions, balancing the number of transistors among the partitions, and reducing circuit overlap within the plurality of partitions. In an alternate embodiment, the load balance among partitions is adjusted to obtain a partition size of less than about 110% of the model size. In still another embodiment, the load balance is adjusted to obtain a partition size of less than about 120% of the model size.

Figure 6:
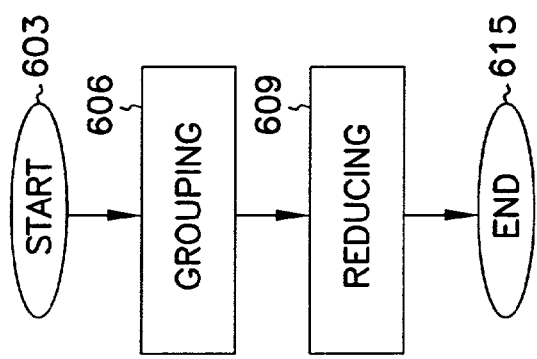
FIG. 6 is a flow diagram of some embodiments of a method of preparing a circuit model for simulation while reducing the inter-partition communication.

FIG. 6 is a flow diagram of some embodiments of a method 600 of preparing a circuit model for simulation while reducing inter-partition communication in the simulation. Reducing the inter-partition communication time in a simulation allows the simulation to complete more quickly. Method 600 begins at start 603 and includes a grouping 606 operation, a reducing 609 operation, and terminates at end 615. Extended latch boundary components are partitioned according to different criteria. In one embodiment, in the grouping 606 operation, the extended latch boundary components are grouped to reduce the communication time within the plurality of partitions. This is accomplished by grouping in the same partition the extended latch boundary components that are tightly coupled. In another embodiment, the reducing 609 operation occurs after a simulation and groups in the same partition extended latch boundary components that demonstrate significant communication between partitions during the simulation. In still another embodiment, in the reducing 609 operation the communication time within the plurality of partitions to less than about ten percent of the total simulation time is achieved by adjusting the grouping of the extended latch boundary components.

Figure 7:
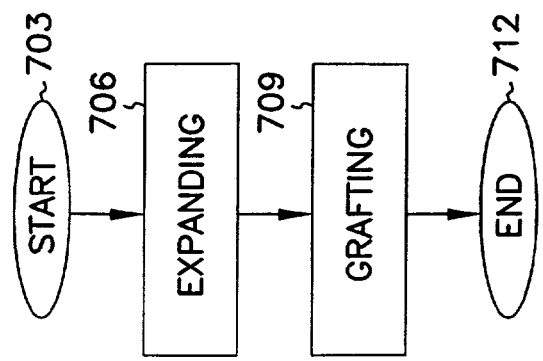
FIG. 7 is a flow diagram of some embodiments of a method of sharing a repeated structure in a circuit model.

FIG. 7 is a flow diagram of some embodiments of a method 700 of sharing a repeated structure in a circuit model. The efficient simulation of large circuits is often constrained by the amount of memory available to hold the circuit model. To reduce the impact of this constraint on large simulations, a repeated structure in a circuit model is shared among partitions. Method 700 permits sharing a repeated circuit structure among the partitions of a simulation. Method 700 begins at start 703, and includes expanding 706, grafting 709, and end 712. Expanding 706 expands the circuit model down to the transistor level. After this initial expansion, which occurs only once for each common sub-circuit definition, instances of the common subcircuits are grafted onto the partition from the definition as needed. This method has improved the memory efficiency in a large simulation by at least a factor of ten.

Figure 8:
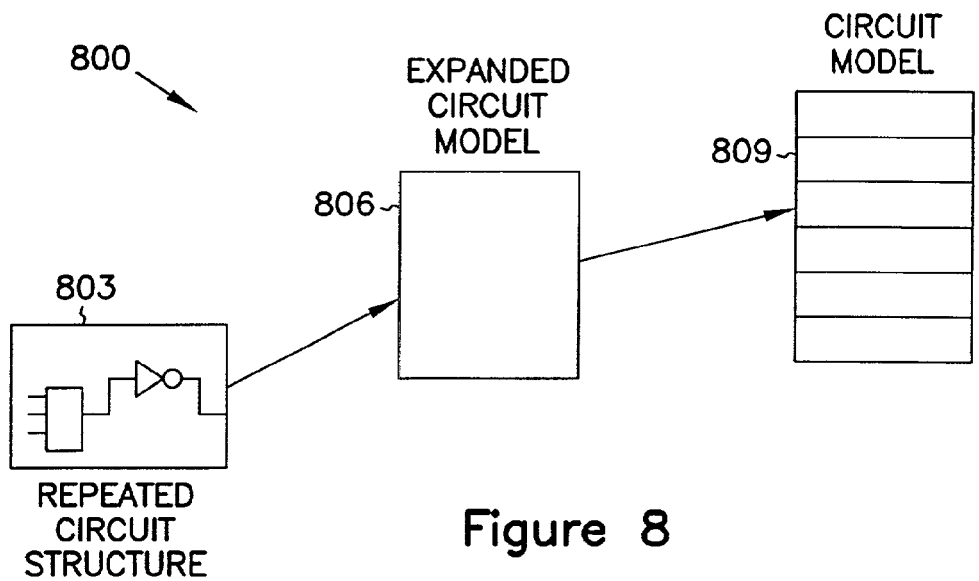
FIG. 8 is a schematic representation of a method of modifying a circuit model from a repeated circuit structure.

FIG. 8 is a schematic representation of a method 800 of modifying a circuit model from a repeated circuit structure. Repeated circuit structure 803 is expanded into expanded circuit model 806, and expanded circuit model 806 is added to circuit model 809 as needed. As described above, expanding the repeated circuit structure once to form an expanded circuit structure, and grafting the expanded circuit structure to the circuit model as needed saves memory space during the simulation of the circuit model. Method 800 includes copying a table 806 representing the expanded circuit structure into the circuit model 809. Only table 809 representing the circuit model is altered.

Figure 9:
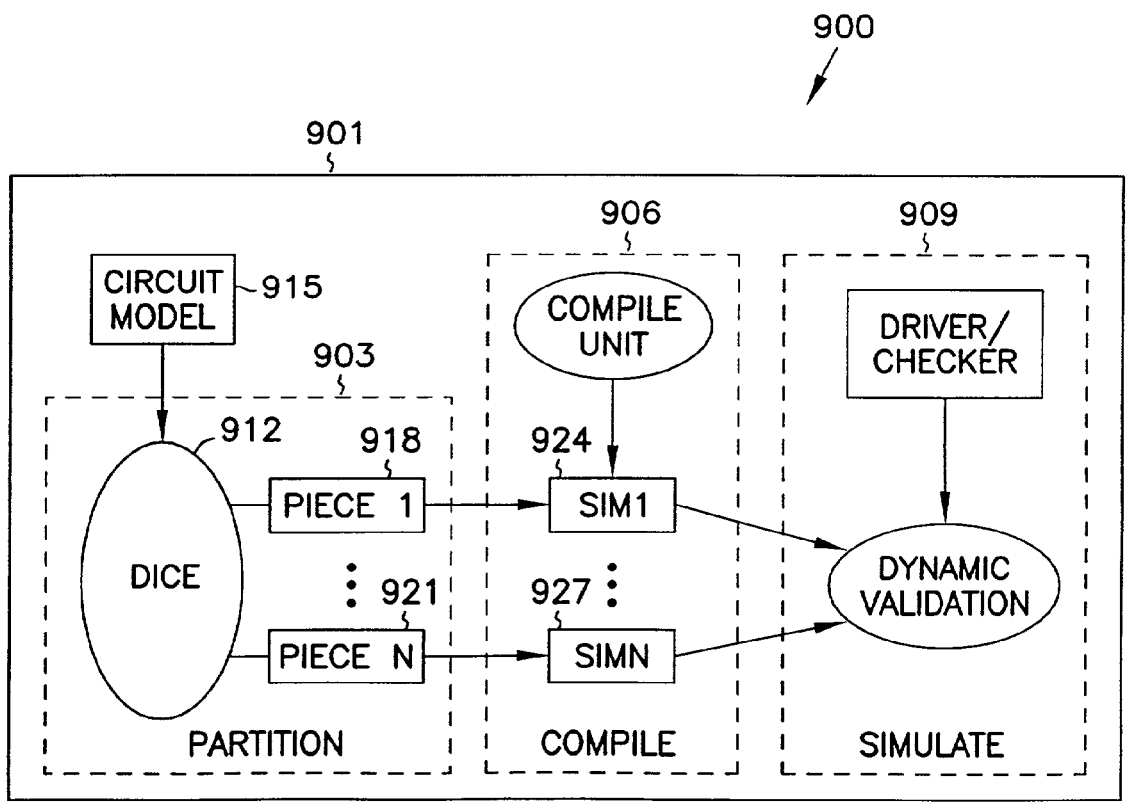
FIG. 9 is a block diagram of some embodiments of a computer system suitable for use in connection with the present invention for preparing a circuit model for simulation and simulating the model.

FIG. 9 is a block diagram of some embodiments of computer system 900 for preparing a circuit model for simulation, compiling the model, and simulating the model. System 900 comprises processor unit 901, partitioning unit 903, compiling unit 906, and simulation unit 909. The present invention is not limited to a particular type of processor unit 901. Uni-processor, multi-processor, and distributed processor units are all suitable for use in connection with the present invention. Partitioning unit 903 includes DICE or dicing unit 912, which is operably coupled to the processor unit, for decomposing and partitioning circuit model 915 to form a plurality of partitions, PIECE 1 918 through PIECE N 921. Methods suitable for use in partitioning unit 903 for decomposing and partitioning circuit model 915 are described above. Compile unit 906 receives partitions PIECE 1 918 through PIECE N 921 from partition unit 903 and compiles those partitions into a plurality of simulations, SIM 1 924 through SIM N 927, respectively. Compile unit 906 is not limited to a particular compiler. Compile unit 906 is any compile unit which is capable of converting a plurality of circuit model partitions into a plurality of simulations. Simulate unit 909 is operably coupled to compile unit 906 and processor unit 901, and receives SIM 1 924 through SIM N 927 from compile unit 906 and is capable of simulating SIM 1 924 through SIM N 927 on processor unit 901. The simulation function of simulate unit 909 can also include functions such as checking and validation.

Although specific embodiments have been illustrated and described herein, it will be appreciated by those of skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A computer-implemented method of preparing a circuit model for simulation comprising:
    decomposing the circuit model having a number of latches into a plurality of extended latch boundary components; and
    partitioning the plurality of extended latch boundary components using a bin-packing heuristic, wherein using the bin-packing heuristic comprises
    constructing a plurality of seeds from the plurality of extended latch boundary components
    merging the plurality of extended latch boundary components with the plurality of seeds; loading the decomposed circuit model into memory.

2. A computer-implemented method of preparing a circuit model for simulation comprising:
    decomposing the circuit model having a number of latches into a plurality of extended latch boundary components;
    partitioning the plurality of extended latch boundary components using a bin-packing heuristic, wherein decomposing the circuit model having a number of latches into a plurality of extend latch boundary components comprises
    identifying an extended latch boundary component that meets a size constraint for at least one of a plurality of hierarchical cells; loading the decomposed circuit model into memory.

3. The method of claim 2, wherein partitioning the plurality of extended latch boundary components comprises:
    grouping the plurality of extended latch boundary components into a plurality of partitions by approximately equalizing the number of latches in each of the plurality of partitions.

4. A computer-implemented method of preparing a circuit model for simulation comprising:
    decomposing the circuit model having a number of latches into a plurality of extended latch boundary components;
    partitioning the plurality of extended latch boundary components using a bin-packing heuristic, wherein partitioning the plurality of extended latch boundary components comprises grouping the plurality of extended latch boundary components to form a plurality of partitions, each of the plurality of partitions having a size; loading the decomposed circuit model into memory.

5. The method of claim 4, wherein partitioning the plurality of extended latch boundary components comprises:

partitioning the plurality of extended latch boundary components by approximately equalizing the number of latches in each of the plurality of partitions, approximately equalizing the latches that are activated in each of the plurality of partitions, and approximately equalizing the size of each of the plurality of partitions.

6. A computer-implemented method of preparing a circuit model for simulation comprising:

decomposing the circuit model having a number of latches into a plurality of extended latch boundary components;

partitioning the plurality of extended latch boundary components using a bin-packing heuristic, wherein partitioning the plurality of extended latch boundary components comprises partitioning the plurality of extended latch boundary components based on activity load balancing; loading the decomposed circuit model into memory.

7. A computer-implemented method of preparing a circuit model for simulation, the circuit model having a model size, comprising:

merging a plurality of extended latch boundary components into a plurality of partitions having a partition size using a bin-packing heuristic;

maintaining a load balance within the plurality of partitions;

reducing circuit overlap within the plurality of partitions;

adjusting the load balance to obtain a partition size of less than about 120% of the model size; loading the plurality of partitions into memory.

8. The method of claim 7, further comprising:

adjusting the load balance to obtain a partition size of less than about 110% of the model size.

9. A computer-implemented method of preparing a circuit model for a simulation having a total simulation time, the method comprising:

grouping a plurality of extended latch boundary components into a plurality of partitions using a bin-packing heuristic;

reducing the communication time within the plurality of partitions by adjusting the grouping;

reducing the communication time within the plurality of partitions to less than about ten percent of the total simulation time by adjusting the grouping; loading the plurality of partitions into memory.

10. A computer-implemented method of sharing a repeated circuit structure among partitions created using a bin-packing heuristic in a circuit model, the method comprising:

expanding the repeated circuit structure once to form an expanded circuit structure;

grafting the expanded circuit structure to the circuit model as needed, wherein grafting the expanded circuit structure to the circuit model as needed comprises copying a table representing the expanded circuit structure into the circuit model; loading the expanded circuit structure into memory.

11. A computer-implemented method of sharing a repeated circuit structure among partitions created using a bin-packing heuristic in a circuit model, the method composing:

expanding the repeated circuit structure once to form an expanded circuit structure;

grafting the expanded circuit structure to the circuit model as needed, wherein grafting the expanded circuit structure to the circuit model as needed comprises altering a table representing the circuit model to add the expanded circuit structure; loading the expanded circuit structure into memory.

12. A computer system comprising:

a processor unit;

a dicing unit operably coupled to the processor unit, capable of executing on the processor unit, and capable of decomposing a circuit model into a plurality of extended latch boundary components, and capable of partitioning the plurality of extended latch boundary components; and a simulation unit operably coupled to the dicing unit and the processor unit, and capable of executing on the processor unit.

13. The computer system of claim 12, wherein the processor unit is a plurality of distributed processor units.

14. The computer system of claim 13, wherein the dicing unit is capable of load balancing.

15. The computer system of claim 14, wherein the dicing unit is capable of activity load balancing.

* * * * *

UNITED STATES PATENT AND TRADEMARK OFFICE
CERTIFICATE OF CORRECTION

PATENT NO. : 7,171,347 B2  
APPLICATION NO. : 09/347690  
DATED : January 30, 2007  
INVENTOR(S) : Khaira et al.

It is certified that error appears in the above-identified patent and that said Letters Patent is hereby corrected as shown below:

In column 6, line 35, in Claim 1, after "components" insert -- , --.

In column 6, line 37, in Claim 1, delete "seeds;" and insert -- seeds, and --, therefor.

In column 6, line 47, in Claim 2, delete "extend" and insert -- extended --, therefor.

In column 6, line 51, in Claim 2, delete "cells;" and insert -- cells, and --, therefor.

In column 7, line 3, in Claim 4, delete "size;" and insert -- size, and --, therefor.

In column 7, line 23, in Claim 6, delete "balancing;" and insert -- balancing, and --, therefor.

In column 7, line 35, in Claim 7, after "size;" insert -- and --.

In column 8, line 3, in Claim 9, after "grouping;" insert -- and --.

In column 8, line 15, in Claim 10, delete "model;" and insert -- model, and --, therefor.

In column 8, lines 19-20, in Claim 11, delete "composing:" and insert -- comprising: --, therefor.

In column 8, line 27, in Claim 11, delete "structure;" and insert -- structure, and --, therefor.

Signed and Sealed this

Seventeenth Day of April, 2007

JON W. DUDAS  
*Director of the United States Patent and Trademark Office*